United States Patent
Koezuka et al.

(10) Patent No.: US 7,417,241 B2
(45) Date of Patent: Aug. 26, 2008

(54) ION IMPLANTATION METHOD AND METHOD FOR MANUFACTURING SEMICONDUCTOR DEVICE

(75) Inventors: Junichi Koezuka, Kanagawa (JP); Hiroto Shinoda, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 266 days.

(21) Appl. No.: 11/319,207

(22) Filed: Dec. 28, 2005

(65) Prior Publication Data

US 2006/0163494 A1   Jul. 27, 2006

Related U.S. Application Data

(62) Division of application No. 10/927,535, filed on Aug. 27, 2004, now Pat. No. 6,995,079.

(30) Foreign Application Priority Data

Aug. 29, 2003  (JP) ............... 2003-307236

(51) Int. Cl.
   *G21K 5/10*  (2006.01)
   *G21G 5/00*  (2006.01)
   *A61N 5/00*  (2006.01)

(52) U.S. Cl. .............. 250/492.21; 250/492.2; 250/492.3; 427/523; 427/530

(58) Field of Classification Search .......... 250/492.21
   See application file for complete search history.

(56) References Cited

U.S. PATENT DOCUMENTS

| | | | |
|---|---|---|---|
| 3,520,741 A | | 7/1970 | Mankarious |
| 3,607,449 A | * | 9/1971 | Tokuyama et al. .......... 438/535 |
| 4,559,096 A | * | 12/1985 | Friedman et al. ......... 156/272.2 |
| 4,716,127 A | | 12/1987 | Shukuri et al. |
| 4,946,706 A | * | 8/1990 | Fukuda ....................... 427/455 |
| 5,352,899 A | * | 10/1994 | Golovanivsky et al. 250/492.21 |
| 5,587,226 A | * | 12/1996 | Leung et al. ................. 428/210 |
| 5,789,744 A | | 8/1998 | Spence et al. |
| 5,814,819 A | * | 9/1998 | Sinclair et al. ......... 250/492.21 |
| 6,013,332 A | | 1/2000 | Goto et al. |
| 6,086,962 A | * | 7/2000 | Mahoney et al. ............ 427/577 |
| 6,504,294 B1 | * | 1/2003 | Mahoney et al. ......... 313/359.1 |

(Continued)

OTHER PUBLICATIONS

Platow et al., "Oxygen Implants Using Water Vapor as Source Feed Gas in High and Medium Current Implanters", Ion Implantation Technology, 2002; Proceedings of the 14th International Conference on Sep. 22-27, 2002; pp. 428-431.

*Primary Examiner*—David A. Vanore
*Assistant Examiner*—Bernard Souw
(74) *Attorney, Agent, or Firm*—Nixon Peabody LLP; Jeffrey L. Costellia

(57) ABSTRACT

An object of the present invention is to provide an ion implantation method for shortening a down time of an ion implantation apparatus after exposure of a chamber and for improving throughput and a method for manufacturing a semiconductor device. Specifically, the object of the invention is to provide an ion implantation method that can improve throughput during an ion implantation step of B and a method for manufacturing a semiconductor device. The ion implantation method comprises the steps of: introducing an impurity imparting p-type conductivity and $H_2O$ in an ion source; ionizing the impurity imparting p-type conductivity; and implanting into a semiconductor film.

14 Claims, 13 Drawing Sheets

U.S. PATENT DOCUMENTS

| | | |
|---|---|---|
| 6,995,079 B2 * | 2/2006 | Koezuka et al. ............. 438/514 |
| 2002/0100876 A1 | 8/2002 | Murakoshi et al. |
| 2002/0125423 A1 * | 9/2002 | Ebeling et al. .............. 250/288 |
| 2002/0155679 A1 | 10/2002 | Ogura et al. |
| 2002/0166975 A1 * | 11/2002 | Reyes .................... 250/423 R |
| 2004/0000651 A1 | 1/2004 | Horsky et al. |
| 2006/0163494 A1 * | 7/2006 | Koezuka et al. .......... 250/492.2 |
| 2006/0272775 A1 * | 12/2006 | Horsky et al. .......... 156/345.37 |
| 2007/0170372 A1 * | 7/2007 | Horsky ....................... 250/427 |
| 2007/0170395 A1 * | 7/2007 | Ichinose et al. ........ 252/299.61 |
| 2007/0210260 A1 * | 9/2007 | Horsky et al. ............... 250/424 |
| 2007/0272776 A1 * | 11/2007 | Schenk ...................... 241/24.1 |
| 2008/0042580 A1 * | 2/2008 | Horsky ................. 315/111.81 |

* cited by examiner

ION IMPLANTATION METHOD AND METHOD FOR MANUFACTURING SEMICONDUCTOR DEVICE

BACKGROUND OF THE INVENTION

1. Field of the Invention

The present invention relates to an ion implantation method and more specifically to a method for manufacturing a semiconductor device using the ion implantation method.

2. Description of the Related Art

An ion implantation method is one of doping methods of an impurity. Compared to other doping methods such as a doping method during film formation and a thermal diffusion method, the ion implantation method has an extremely large ion implantation amount and extremely high control accuracy of an implantation depth, and has a merit capable of low concentration control. Dopant used for a semiconductor device can be roughly classified into n-type dopant and p-type dopant. A Group 5 element such as phosphorus (P), arsenic (As), or antimony (Sb), a Group 6 element such as sulfur (S), tellurium (Te), or selenium (Se), or the like that functions as a donor is known as an impurity element imparting n-type conductivity, and P is mainly used in an industry. In addition, a Group 3 element such as boron (B), aluminum (Al), gallium (Ga), or indium (In), a Group 2 element such as zinc (Zn), or the like that functions as an acceptor is known as an impurity element imparting p-type conductivity, and B is mainly used in an industry.

Ion implantation is carried out in a chamber by generating an ion from an ion source, extracting an ion by applying an electric field, splitting an ion that is needed with an analyzing magnet, accelerating the ion in electrostatic up to an acceleration energy that is needed, and implanting the ion into a semiconductor film formed over a substrate.

Usually, loading and unloading of a substrate to a chamber in an ion implantation apparatus is carried out through a load lock chamber. Therefore, the apparatus can be operated without exposing the chamber to the atmosphere. However, it is necessary to expose the chamber to the atmosphere regularly for, for example, maintenance. In this case, the inside of the chamber is replaced by a doping gas after the chamber is exposed to an atmosphere; however, a constituent such as water adhered to the inside of the chamber by being exposed to the atmosphere is remained for a certain periods after operating the apparatus. Thus, treatment over a substrate has to be refrained until an ion species ratio is stabilized and there is a problem that a long down time ranging from 40 hours to 50 hours is needed for aging.

In addition, compared to P, B generally has a low ion species ratio at the time of ion implantation; therefore, B is inferior in respect of throughput. Although it is possible to raise the ion species ratio of B to some extent by increasing a flow or a concentration of a gas that serves as dopant, it is still inadequate to obtain throughput equivalent to P. Moreover, compared to P, B is subject to variation since the ion species ratio is low; therefore, there is a problem that a longer down time is needed to stabilize the ion species ratio after the chamber is exposed to the atmosphere.

SUMMARY OF THE INVENTION

In view of the above problems, an object of the present invention is to provide an ion implantation method for shortening a down time of an ion implantation apparatus after exposure of a chamber and for improving throughput and a method for manufacturing a semiconductor device. Specifically, the object of the invention is to provide an ion implantation method that can improve throughput during an ion implantation step of B and a method for manufacturing a semiconductor device.

The inventors found that an ion species ratio in the chamber and change of moisture concentration over time have close relation with each other. FIG. 1 shows the ratio of $H_2O$ and the ion species ratio of B to a time of using a filament of an ion source in an ion implantation apparatus, which are obtained by a mass spectrum. Note that $B_2H_6$ is used as dopant, and $H_2O$ is shown as a ratio to $H_3^+$ and the ion species of B is shown as a ratio of $B_2H_y^+$ to the sum of $H^+$, $H_2^+$, $H_3^+$, $BH_x^+$, and $B_2H_y^+$.

According to FIG. 1, as the time of using a filament gets longer, although there are a few vertical variations, the ratio of $H_2O$ in the chamber is lowered, and it is infinitely converged to a value close to 0. On the other hand, the ion species ratio of B is lowered while varying vertically as well as the ratio of $H_2O$ is lowered, and the timing of the vertical variation corresponds to timing in which $H_2O$ is varied. Accordingly, there is some sort of a correlation between the ratio of $H_2O$ and the ion species ratio of B, and it is predicted that generation of ion species of B is promoted by the existence of $H_2O$.

In the ion implantation method and the method for manufacturing a semiconductor device of the invention, $H_2O$, as well as a gas used as dopant, is supplied continuously and successively to the chamber, and the ratio of the $H_2O$ in the chamber is kept constant by taking advantage of the above phenomenon reversely. As a specific supplying method, an inert gas containing $H_2O$ may be supplied to the chamber, or $H_2O$ itself can be supplied directly to the chamber.

Note that a semiconductor device included in a category of the invention has every possible semiconductor device, for example, an integrated circuit such as a microprocessor or an image processing circuit, a semiconductor display device, or the like. The semiconductor display device includes in the category a liquid crystal display device, a light-emitting device provided with a light-emitting element typified by an organic light-emitting element (OLED) for each pixel, a DMD (Digital Micromirror Device), a PDP (Plasma Display Panel), a FED (Field Emission Display), and the like, and other display devices having a circuit element using a semiconductor film in a driver circuit.

DETAILED DESCRIPTION OF THE INVENTION

[Best Mode for Carrying Out the Invention]

Hereinafter, embodiment mode of the present invention will be described below with reference to the accompanying drawings. However, it is to be understood that various changes and modifications will be apparent to those skilled in the art. Therefore, the invention is not interpreted with limiting to the description in this embodiment mode.

Figure 1:
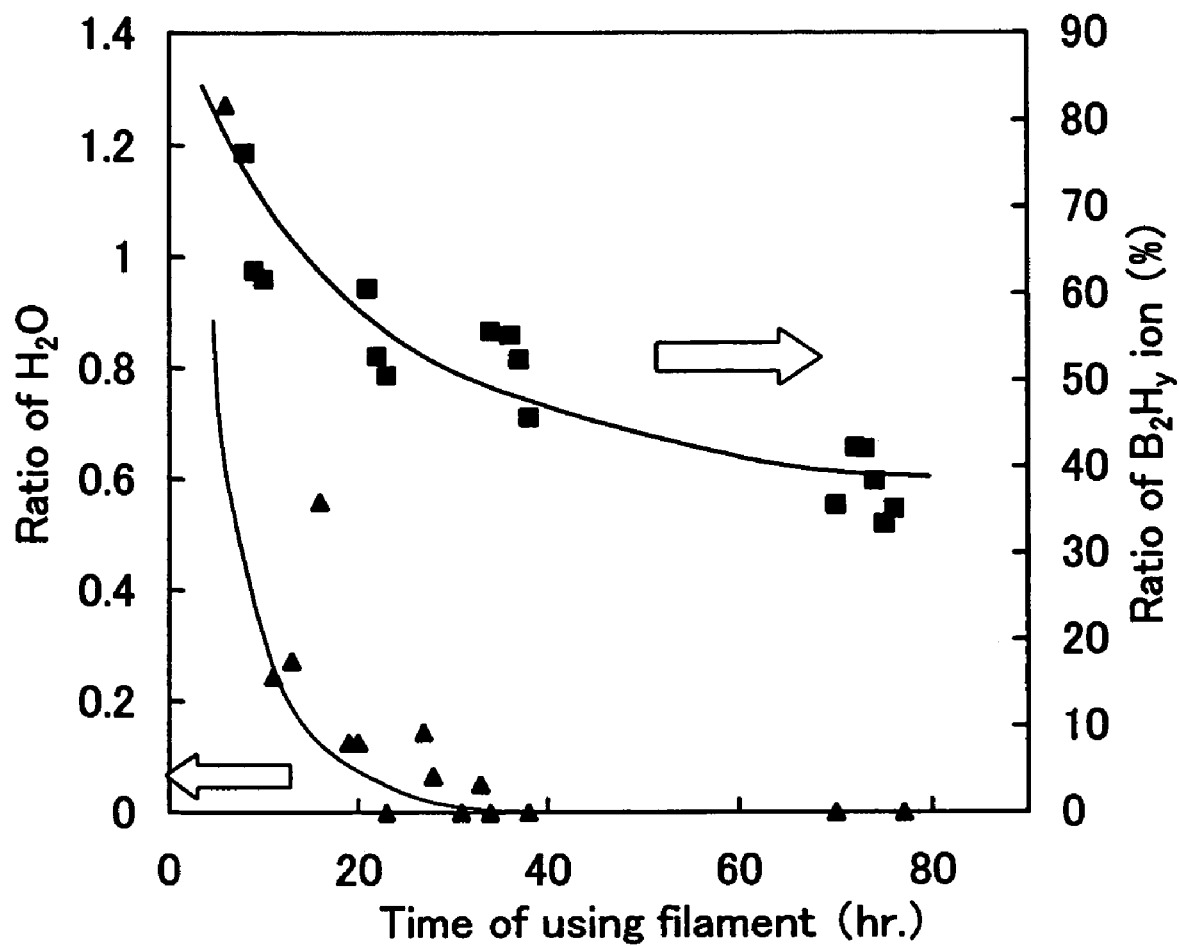
FIG. 1 is a graph showing a component ratio of $H_2O$ and an ion species ratio of B to a time of using a filament.
Figure 2:
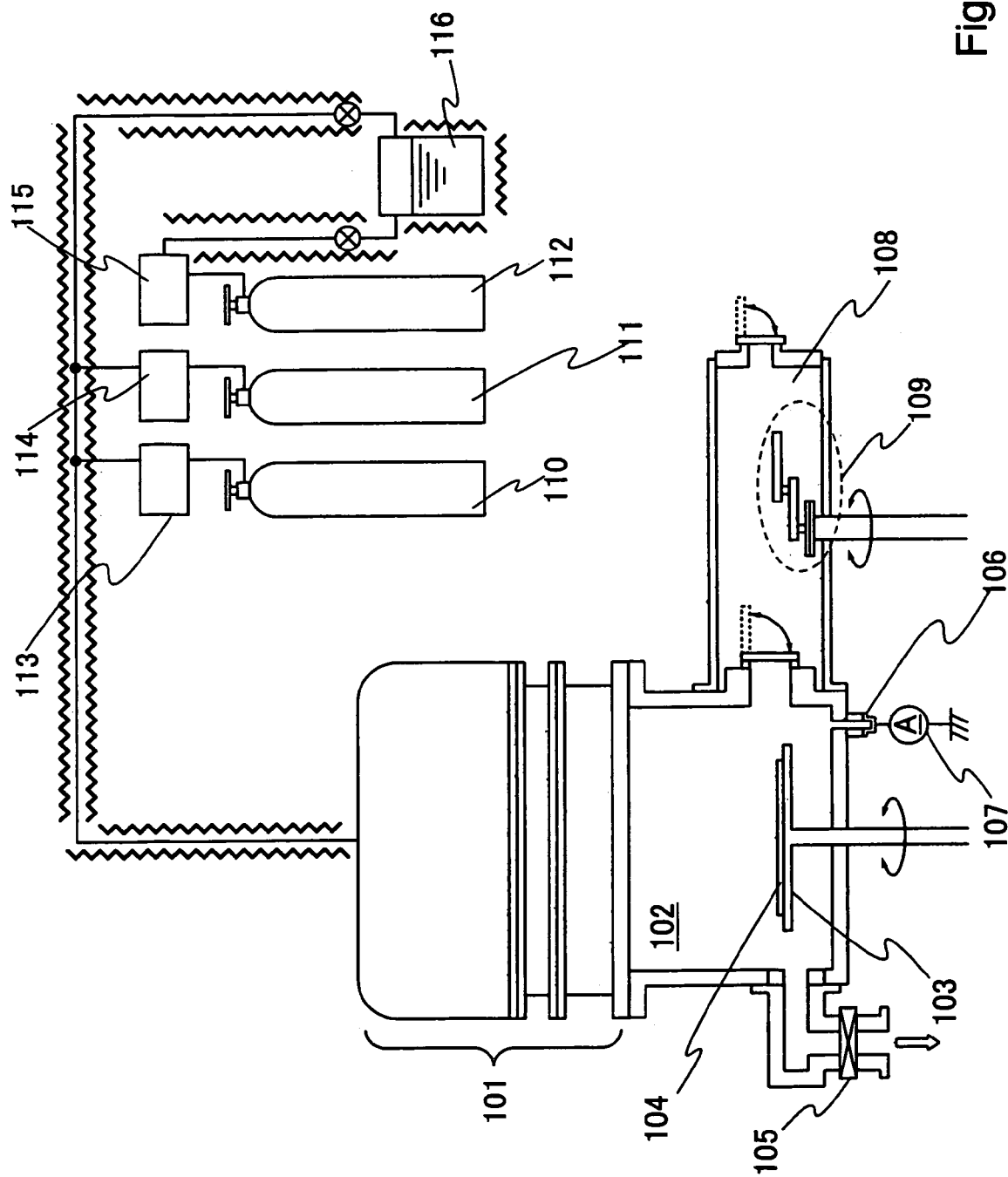
FIG. 2 is a view showing a structure of an ion implantation apparatus used in the present invention.

FIG. 2 shows a structure of an ion implantation apparatus used in an ion implantation method and a method for manufacturing a semiconductor device of the invention. In FIG. 2, reference numeral 101 denotes an ion source; 102, a chamber, 103, a stage on which a substrate 104 is placed; 105, a valve between the chamber 102 and a vacuum pumping system; 106, a Faraday cup; and 107, a current integrator. In addition, a load lock chamber 108 is provided adjacent to the chamber 102, and a transport means 109 to transport the substrate 104 to the chamber 102 is supplied to the load lock chamber 108.

A gas used as dopant can be supplied to the chamber 102 from dopant supplying means 110 and 111. In addition, an inert gas can be supplied to the chamber 102 from an inert gas supplying means 112. Flow of dopant supplied from the dopant supplying means 110 and 111 to the chamber 102 can be controlled by flow controlling means 113 and 114. Moreover, flow of the inert gas supplied from the inert gas supplying means 112 to the chamber 102 can be controlled by a flow controlling means 115.

Note that mode using two dopant supplying means 110 and 111 is shown in FIG. 2; however, the number of a dopant supplying means is not limited thereto and a practitioner can determine the number appropriately. An impurity element imparting p-type conductivity can be used for dopant and, for example, B, Al, Ga, In, Zn, or the like can be used. Herein, B is assumed to be used as dopant.

In addition, reference numeral 116 denotes a means for adding $H_2O$ ($H_2O$ supplying means) into the inert gas supplied from the inert gas supplying means 112 to the chamber 102. FIG. 2 shows mode in which the inert gas added with $H_2O$ is supplied to the chamber 102; however, the supply of $H_2O$ to the chamber 102 is not limited thereto. Alternatively, $H_2O$ may be supplied directly to the chamber 102. For example, nitrogen, argon, or the like can be used for an inert gas used to supply $H_2O$.

FIG. 2 shows a situation in which a dopant gas and an inert gas added with $H_2O$ are introduced into the chamber 102 from a gas inlet provided for the ion source 101; however, the gas inlet is not limited to the mode shown in FIG. 2. In addition, the ion source 101 is classified into a high-frequency discharge type and a DC arc discharge type, according to a plasma generating method; however, either ion source is applicable to the invention. A structure of a high-frequency discharge type ion source 101 is shown in FIG. 4 and a DC arc discharge type ion source 101 is shown in FIG. 5.

Figure 4:
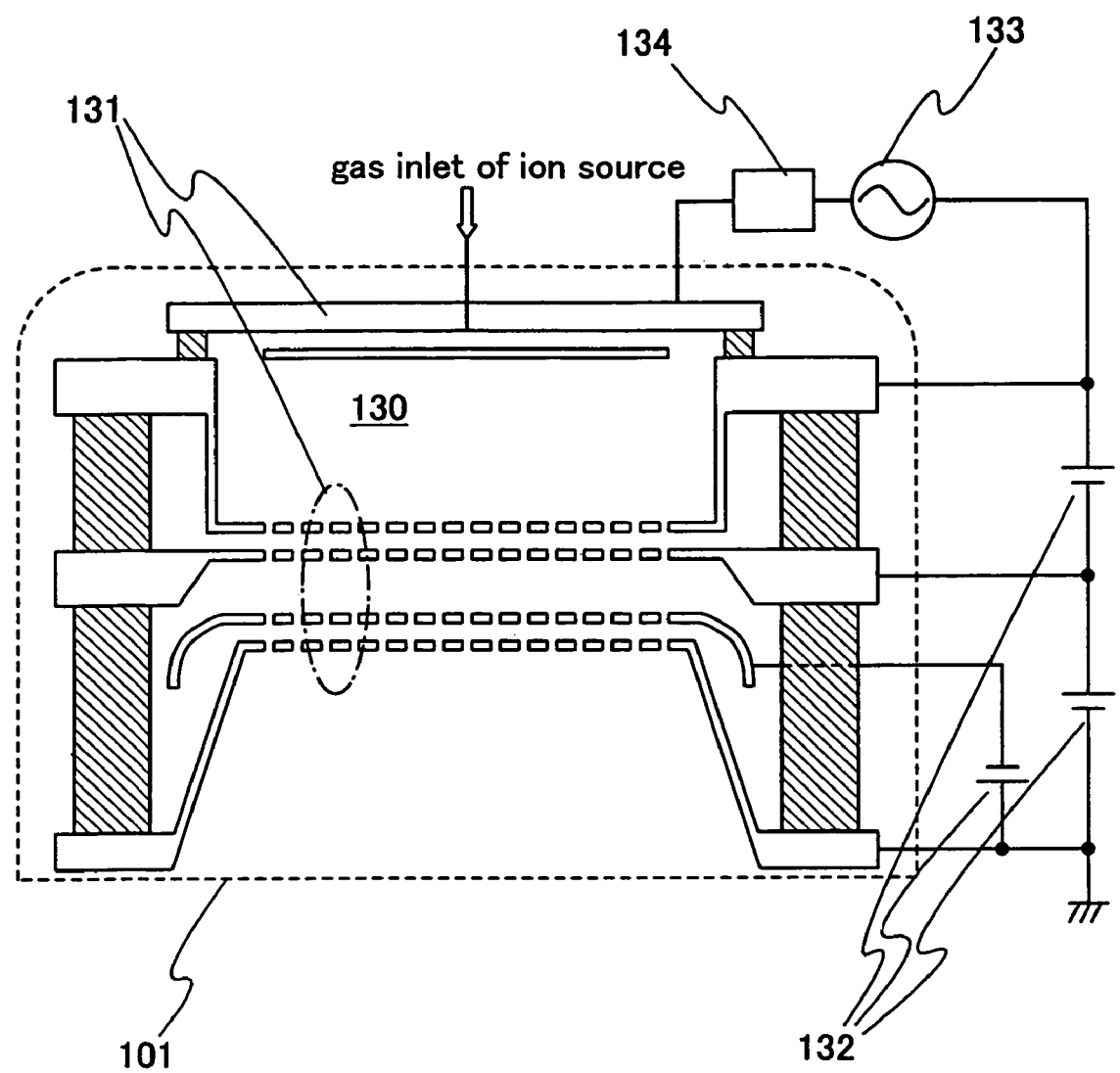
FIG. 4 is a view showing a structure of a high-frequency discharge type ion source.

The high-frequency discharge type ion source 101 shown in FIG. 4 includes a plasma source 130 in which plasma is generated, an extraction/acceleration electrode system 131 having a plurality of electrodes for extracting and accelerating a generated ion, a power supply system for acceleration voltage 132 having a plurality of power supplies for applying an acceleration voltage to the extraction/acceleration electrode system, a high frequency power supply 133 for controlling generation of plasma, and a matching box 134.

Figure 5:
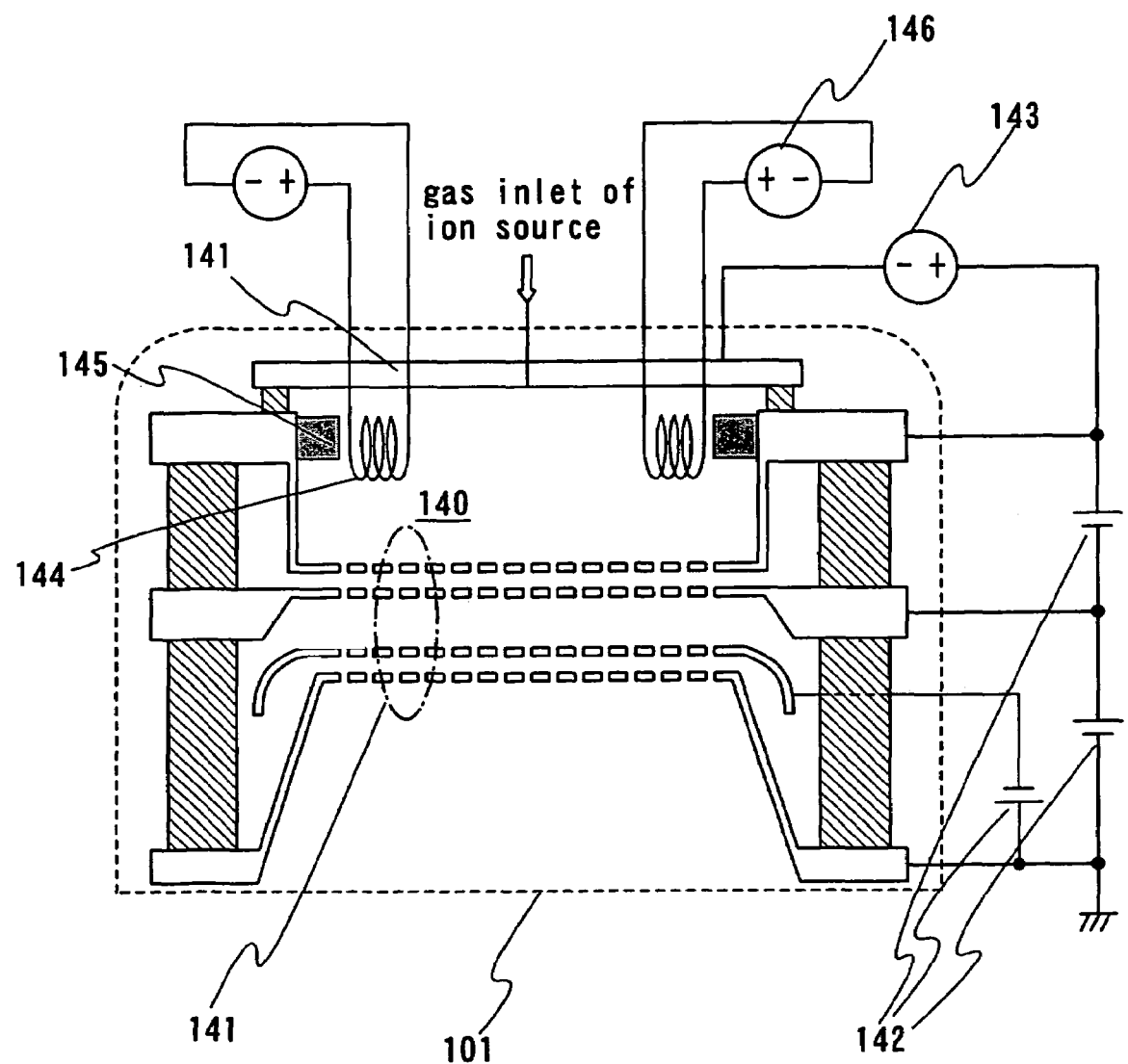
FIG. 5 is a view showing a structure of a DC arc discharge type ion source.

The DC arc discharge type ion source 101 shown in FIG. 5 includes a plasma source 140 in which plasma is generated, an extraction/acceleration electrode system 141 having a plurality of electrodes for extracting and accelerating a generated ion, a power supply system for accelerating voltage 142 having a plurality of power supplies for applying an acceleration voltage to the extraction/acceleration electrode system, a DC power supply 143 for preventing generation of plasma, a filament 144 and an anode ring 145 to generate plasma, and a filament power supply 146 to control the potential of the filament 144.

As shown in FIGS. 4 and 5, dopant, added with $H_2O$, introduced from the gas inlets of the ion source is ionized in the plasma sources 130 and 140. Note that the ion sources of two-stage acceleration type is shown in FIGS. 4 and 5; however, the ion source that can be used in the invention is not limited thereto and one-stage acceleration type may be also employed.

Note that the amount of $H_2O$ supplied for the chamber 102 can be controlled by a flow rate of an inert gas, a vapor pressure of $H_2O$ supplied from the $H_2O$ supplying means 116, or the like. In addition, the concentration of $H_2O$ in the chamber 102 can be actually grasped by mass spectroscopy such as QMS.

Figure 3:
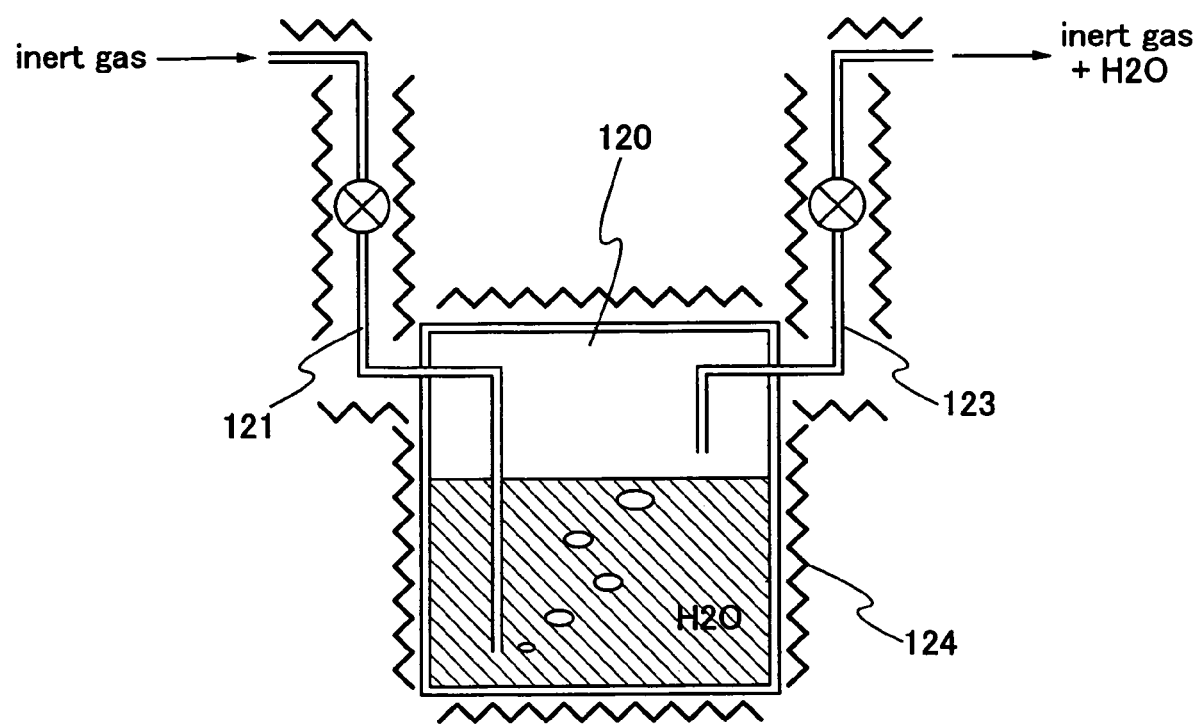
FIG. 3 is a view showing a structure of an $H_2O$ supplying means.

One mode of the $H_2O$ supplying means 116 is shown in FIG. 3. The $H_2O$ supplying means shown in FIG. 3 includes a tank 120 in which $H_2O$ is contained, a conduit 121 to supply an inert gas for the tank 120, and a conduit 123 to exhaust the inert gas from the tank 120. The inert gas with which the tank 120 is supplied from the conduit 121 is exhausted through the conduit 123 after staying under $H_2O$ contained in the tank 120; therefore, $H_2O$ is added into the inert gas exhausted through the conduit 123.

In addition, reference numeral 124 denotes a means for regulating a temperature in the tank 120 (temperature regulating means). A vapor pressure of water in the tank 120 can be controlled by regulating a temperature in the tank 120 by the temperature regulating means 124. The amount of the $H_2O$ in the inert gas exhausted from the conduit 123 depends on the flow rate of the inert gas and a vapor pressure of water in the tank 120.

According to the above embodiment of the invention, the concentration of $H_2O$ in the chamber can be kept constant regardless of exposure to the atmosphere. Thus, an ion species ratio of B can be stabilized. Therefore, a down time of the ion implantation apparatus after exposing the chamber to the atmosphere can be shorten and throughput can be improved. In addition, $H_2O$ is supplied to the chamber, so that the ion species ratio of B can be raised much more and throughput during the ion implantation step of B can be improved as compared to the case when the concentration of $H_2O$ is infinitely converged to 0.

EMBODIMENT 1

Next, a specific method for manufacturing a semiconductor device of the present invention is described. Note that this embodiment is described by giving the case where an n-channel type TFT and a p-channel type TFT are manufactured over one substrate as an example.

Figure 6A:
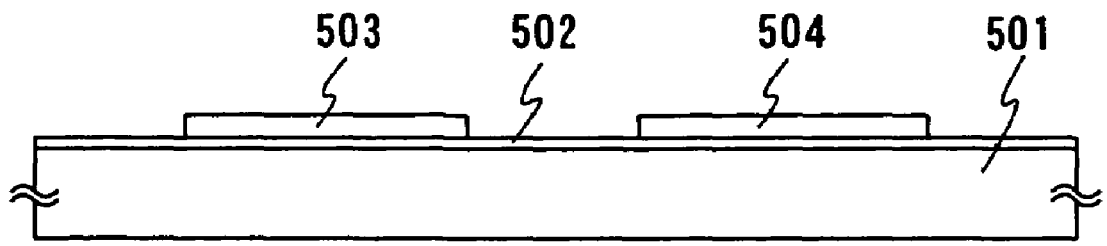
FIGS. 6A to 6C are views showing a method for manufacturing a semiconductor device of the invention.

First, as shown in FIG. 6A, a base film 502 is formed on an insulating surface of a substrate 501. For example, a glass substrate such as barium borosilicate glass or alumino borosilicate glass, a quartz substrate, a ceramic substrate, or the like can be used for the substrate 501. In addition, a metal substrate including a stainless steel substrate or a surface of a substrate on which an insulating film is formed may be used. A substrate made of a synthetic resin having flexibility such as plastic generally tends to have a lower heat resistant temperature than that of the above substrates. However, it can be used as long as it can withstand a processing temperature in a manufacturing step.

The base film 502 is provided to prevent alkali metal such as Na or alkaline earth metal contained in the substrate 501 from diffusing into a semiconductor film and giving an adverse effect to properties of a semiconductor element. Thus, the base film 502 is formed by using an insulating film such as silicon oxide, silicon nitride, or silicon nitride oxide which can control diffusion of alkali metal or alkaline earth metal into a semiconductor film. In this embodiment, a silicon nitride oxide film is formed by using a plasma CVD method to have a film thickness ranging from 10 nm to 400 nm (preferably, from 50 nm to 300 nm).

Note that silicon oxynitride is an insulating film expressed by $SiO_xN_y$ (x>y) in this specification, which is distinguished from silicon nitride oxide expressed by $SiN_xO_y$ (x>y).

The base film 502 may be formed in either a single layer or a laminated layer of a plurality of insulating films. In addition, when a substrate containing some sort of alkali metal or alkaline earth metal, for example, a glass substrate, a stainless steel substrate, or a plastic substrate is used, it is effective to provide a base film in respect of preventing diffusion of an impurity. However, it is not necessarily needed to provide a base film when diffusion of an impurity is less problematic as the case of a quartz substrate.

Then, island-shape semiconductor films 503 and 504 used as active layers are formed on the base film 502. The film thicknesses of the island-shape semiconductor films 503 and 504 are set to range from 25 nm to 100 nm (preferably, from 30 nm to 60 nm). Note that the island-shape semiconductor films 503 and 504 may be an amorphous semiconductor, a semi-amorphous semiconductor (microcrystal semiconductor), or a polycrystalline semiconductor. In addition, not only silicon but also silicon germanium can be used as a semiconductor. When silicon germanium is used, the concentration of germanium preferably ranges from 0.01 atomic % to 4.5 atomic %.

When a polycrystalline semiconductor is used, first, an amorphous semiconductor film is formed, and the amorphous semiconductor film may be crystallized by using a known crystallization method. A method for carrying out crystallization with heating by a heater, a method for carrying out crystallization with irradiation of laser light, a method for carrying out crystallization by using catalyst metal, a method for carrying out crystallization by using infrared light, or the like is given as an example of the known crystallization method.

For example, when crystallization is carried out by using laser light, an pulsed or continuous wave excimer laser, YAG laser, $YVO_4$ laser, or the like is used. When a YAG laser is used for example, a wavelength of a second harmonic that is easily absorbed in a semiconductor film is used. An oscillating frequency is set to range from 30 kHz to 300 kHz; and an energy density, from 300 $mJ/cm^2$ to 600 $mJ/cm^2$ (typically, from 350 $mJ/cm^2$ to 500 $mJ/cm^2$), and a scanning speed may be determined so that an optional point can be irradiated by several shots.

Figure 6B:
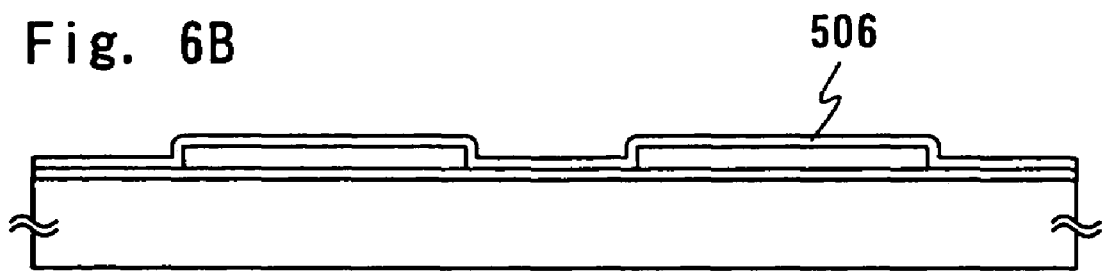

Next, as shown in FIG. 6B, a gate insulating film 506 is formed to cover the island-shape semiconductor films 503 and 504. In subsequent dry etching which is carried out to form a gate electrode, the film thickness of the gate insulating film 506 decreases ranging approximately from 10 nm to 20 nm; therefore, it is preferable that the film thickness is set by taking the decrease into consideration. Specifically, the gate insulating film is formed to have a film thickness ranging approximately from 40 nm to 150 nm (more preferably, from 60 nm to 120 nm).

For example, silicon oxide, silicon nitride or silicon nitride oxide can be used for the gate insulating film 506. A plasma CVD method, a sputtering method, or the like can be used for a deposition method. For example, when a gate insulating film using silicon oxide is formed with a plasma CVD method, it is formed by using a mixed gas of TEOS (Tetraethyl Orthosilicate) and $O_2$, setting a reaction pressure at 40 Pa; a substrate temperature, ranging from 300° C. to 400° C.; and a high-frequency (13.56 MHz) power density, ranging from 0.5 $W/cm^2$ to 0.8 $W/cm^2$.

In addition, aluminum nitride can be used for the gate insulating film 506. Aluminum nitride has comparatively high thermal conductivity and can diffuse heat generated in a TFT efficiently. After silicon oxide, silicon oxynitride, or the like in which aluminum is not contained is formed, aluminum nitride is laminated thereover, which may be used as the gate insulating film.

Figure 6C:
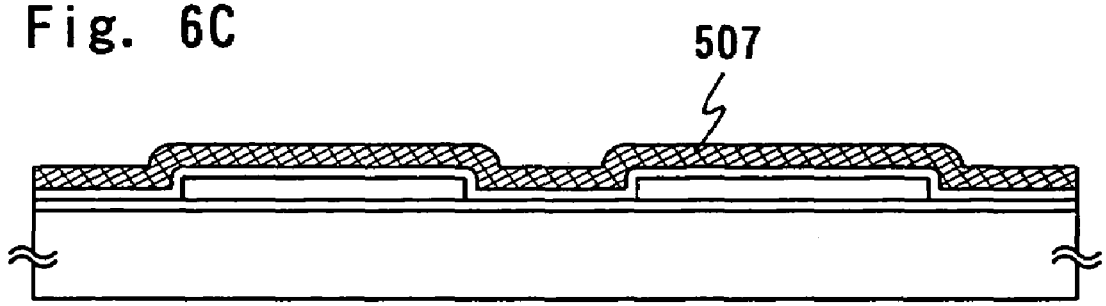

Then, as shown in FIG. 6C, a conductive film 507 is formed on the gate insulating film 506. The conductive film 507 may be formed in a single layer, or, if necessary, in a laminated structure composed of a plurality of layers such as a double layer or a triple layer. In this embodiment, the conductive film 507 is formed to have a film thickness of 300 nm by using W.

Each conductive film can be formed of an element of Ta, W, Ti, Mo, Al, and Cu or an alloy or a compound mainly containing the elements. For example, the combination that a first layer is Ta and a second layer is W, the combination that the first layer is TaN and the second layer is Al, and the combination that the first layer is TaN and the second layer is Cu can be considered. An AgPdCu alloy may be used for either the first layer or the second layer. A triple layer structure in which W, an alloy of Al and Si (Al—Si), and TiN are sequentially laminated may be also used. Tungsten nitrogen may be used instead of W, an alloy film of Al and Ti (Al—Ti) may be used instead of the alloy of Al and Si (Al—Si), or Ti may be used instead of TiN. However, when a plurality of conductive films is formed, a material each of which can take a selection ratio of the etching is used to give a difference in width in a channel length direction of a conductive film in each layer after etching.

For example, the conductive film 507 may be formed by laminating a conductive film made of TaN having a film thickness ranging from 20 nm to 100 nm and a conductive film made of W having a film thickness ranging from 100 nm to 400 nm. In this case, TaN can be formed under a deposition rate of approximately 40 nm/min by using Ta of which purity is 99.99% for a target, setting a temperature in a chamber at a room temperature; a flow rate of Ar, 50 ml/min; a flow rate of $N_2$, 10 ml/min; a pressure in the chamber, 0.6 Pa; and a deposition power, 1 kW. In addition, W can be formed under a deposition rate of approximately 390 nm/min by using W of which purity is 99.99% for a target, setting a temperature in a chamber at 230° C.; a flow rate of Ar, 100 ml/min; a pressure in the chamber, 1.5 Pa; and a deposition power, 6 kW.

Note that it is important to select the most suitable etching gas according to a material of the conductive film. In addition, a material of each conductive layer is not limited to the one shown in this embodiment.

Figure 7A:
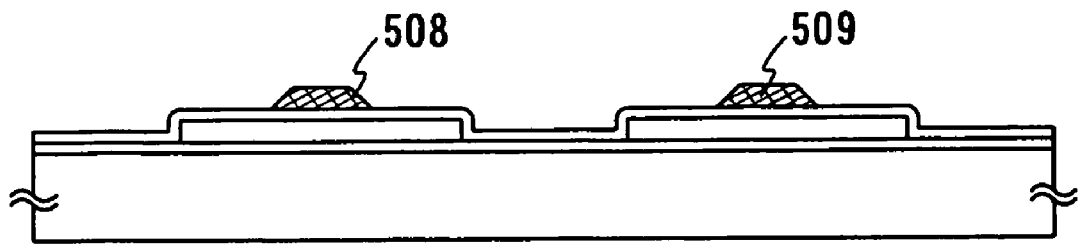
FIGS. 7A to 7C are views showing a method for manufacturing a semiconductor device of the invention.

Next, as shown in FIG. 7A, gate electrodes 508 and 509 are formed by patterning the conductive film 507. In this embodiment, an ICP (Inductively Coupled Plasma) etching method is employed. Etching is carried out by using a mixed gas of $Cl_2$ and $CF_4$ as an etching gas and by supplying RF (13.56 MHz) power of 3.2 $W/cm^2$ under a pressure of 1 Pa to generate plasma. RF (13.56 MHz) power of 224 $mW/cm^2$ is also supplied to a substrate side (sample stage), whereby a negative self-bias is substantially applied thereto. Under this condition, an etching rate of the W film is approximately 100 nm/min. Through the above etching, the edges of the gate electrodes 508 and 509 slightly have taper shapes. In addition, when etching is carried out not to leave a residue of the conductive film, the surface of the gate insulating film 506 not covered with the gate electrodes 508 and 509 is sometimes etched to range from 5 nm to 10 nm or more.

Figure 7B:
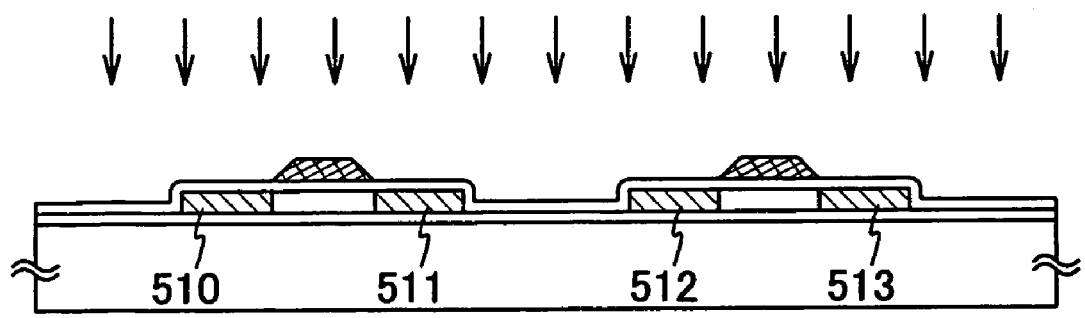

Then, as shown in FIG. 7B, an impurity (dopant) imparting n-type conductivity is added into the island-shape semiconductor films 503 and 504 by using the gate electrodes 508 and 509 as masks (a first doping treatment). Doping is carried out by an ion implantation method. Doping is carried out under a dose amount ranging from $1\times10^{13}$ ions/$cm^2$ to $1\times10^{15}$ ions/$cm^2$ and an acceleration voltage ranging from 30 kV to 90 kV. A Group 5 atom such as P, As, or Sb or a Group 6 atom such as S, Te, or Se that functions as donor is used for an impurity element imparting n-type conductivity; however, P is used in this embodiment. Through the first doping treatment, first impurity regions 510 to 513 are formed in a self-aligned manner. An impurity element imparting n-type conductivity is added into the first impurity regions 510 to 513 to have a concentration range of from $1\times10^{18}$ atoms/$cm^3$ to $1\times10^{20}$ atoms/$cm^3$.

Figure 7C:
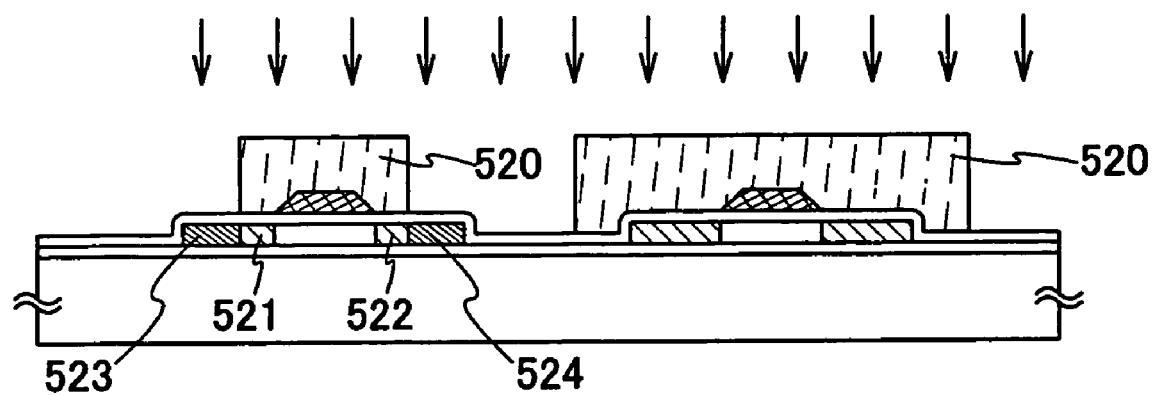

Next, as shown in FIG. 7C, a resist mask 520 is formed so that the semiconductor film 504 is entirely covered to carry out a second doping treatment. The second doping treatment uses the n-type impurity element the same as that of the first doping treatment as dopant, and an acceleration voltage is set to range from 50 kV to 150 kV; and a dose amount, from $1\times10^{15}$ ions/$cm^2$ to $1\times10^{17}$ ions/$cm^2$.

Through the second doping treatment, second impurity regions 521 and 522 are formed in a region overlapped with the resist mask 520, and third impurity regions 523 and 524 are formed by further adding an impurity into the first impurity regions 510 and 511 in the island-shape semiconductor film 503. An impurity element imparting n-type conductivity is added into the second impurity regions 521 and 522 to have a concentration range of from $5\times10^{17}$ atoms/$cm^3$ to $5\times10^{19}$ atoms/$cm^3$. An impurity element imparting n-type conductivity is added into the third impurity regions 523 and 524 to have a concentration range of from $1\times10^{19}$ atoms/$cm^3$ to $5\times10^{21}$ atoms/$cm^3$. The second impurity regions 521 and 522 correspond to Loff regions and the third impurity regions 523 and 524 correspond to a source/drain region.

Note that it is not necessary to dope an n-type impurity into the island-shape semiconductor film 504 in which a p-channel type TFT is formed according to the first doping treatment shown in FIG. 7B; therefore, the semiconductor film 504 may be covered with the resist mask in case of the first doping. In addition, a resist mask is dare not to be provided to reduce the number of a resist mask and a polarity of the island-shape semiconductor film may be reversed to p-type conductivity by increasing the concentration of an impurity imparting p-type conductivity. In this embodiment, the case that the polarity of the island-shape semiconductor film is reversed to p-type conductivity is described.

Figure 8A:
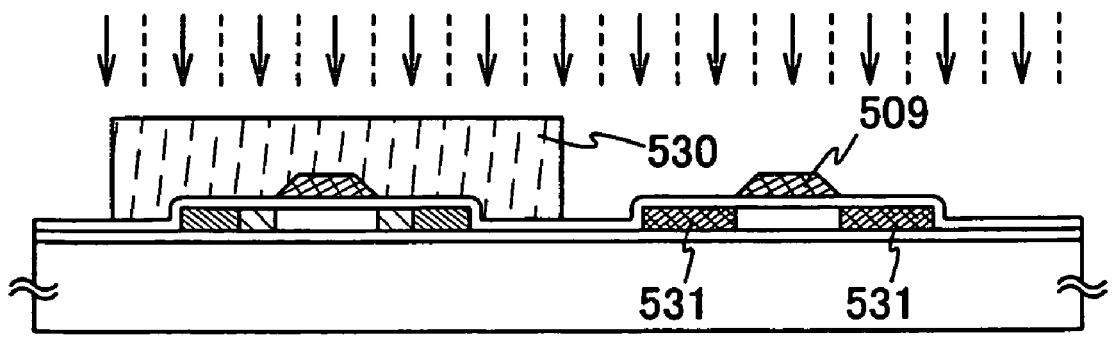
FIGS. 8A to 8C are views showing a method for manufacturing a semiconductor device of the invention.

Then, as shown in FIG. 8A, an impurity imparting p-type conductivity is doped into the island-shape semiconductor film 504 by covering the n-channel type island-shape semiconductor film 503 with a resist mask 530 made of a resist (a third doping treatment). In the third doping treatment, a gate electrode 509 functions as a mask and a fourth impurity region 531 into which an impurity imparting p-type conductivity to the island-shape semiconductor film 504 used for the p-channel type TFT is added is formed. The fourth impurity region 531 is formed by an ion implantation method using diborane ($B_2H_6$) in this embodiment.

Note that B is used as an impurity element imparting p-type conductivity in this embodiment. However, the invention is not limited thereto and other impurity element can be used as long as it is an impurity element imparting the above p-type conductivity. In addition, diborane is used as a n impurity containing B in this embodiment; however, the invention is not limited thereto and other impurity containing B, for example, $BF_3$ or the like may be used.

In this embodiment, a gas diluted with hydrogen so that the concentration of diborane ranges approximately from 3% to 30% and an inert gas added with $H_2O$ are flown into the chamber of the ion implantation apparatus, and thus ion implantation of B is carried out. In this embodiment, a gas diluted with hydrogen so that the concentration of diborane is 5% is flown into the chamber to have a flow rate of 90 sccm. In addition, nitrogen is used as an inert gas, and nitrogen added with $H_2O$ is flown into the chamber at a flow rate of, for example, 5 sccm. The amount of added $H_2O$ is that the component ratio of $H_2O$ to $H_3^+$ in the chamber, for example, ranges approximately from 0.1 to 1. Note that the amount of the added $H_2O$ is not limited thereto and a practitioner may determine the amount of the $H_2O$ appropriately so that the amount of the $H_2O$ in the chamber is constant regardless of opening and closing of the chamber.

In the fourth impurity region 531, doping treatment is carried out so that an impurity element imparting p-type conductivity has the concentration ranging from $2\times10^{20}$ atoms/$cm^3$ to $2\times10^{21}$ atoms/$cm^3$. Thus, p-type conductivity is predominant, so that the fourth impurity region 531 functions as source/drain regions of the p-channel type TFT.

Through the above steps, the impurity region is formed in the island-shape semiconductor films 503 and 504.

Figure 8B:
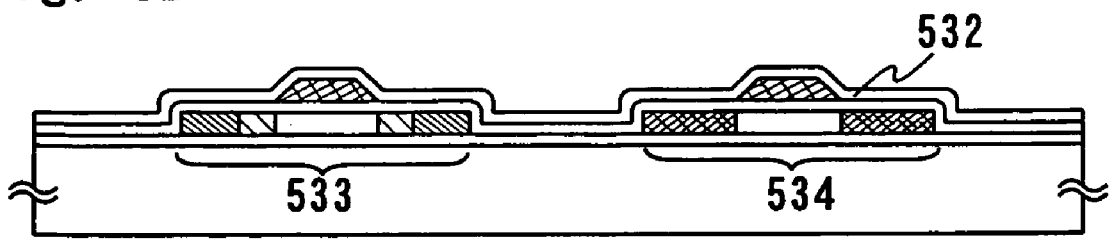

Next, as shown in FIG. 8B, a first interlayer insulating film 532 is formed by covering the island-shape semiconductor films 503 and 504, the gate insulating film 506, and the gate electrodes 508 and 509. An insulating film such as silicon oxide, silicon nitride, or silicon oxynitride containing silicon can be used for the first interlayer insulating film 532 and the film thickness ranges approximately from 100 nm to 200 nm.

Next, heat treatment is carried out to activate an impurity element added into the island-shape semiconductor films 503 and 504. A thermal annealing method using an annealing furnace, a laser annealing method, or rapid thermal annealing (RTA) method can be used in this step. For example, in activating with a thermal annealing method, it is carried out in a nitrogen atmosphere with the oxygen concentration of 1 ppm or less, preferably 0.1 ppm or less, at temperatures ranging from 400° C. to 700° C. (preferably from 500° C. to 600° C.). Furthermore, heat treatment is carried out at temperatures ranging from 300° C. to 450° C. for an hour to 12 hours in an atmosphere containing hydrogen ranging from 3% to 100%, and a step of hydrogenating the island-shape semiconductor films is carried out. This step is carried out for terminating dangling bonds by thermally excited hydrogen. As an alternative method for hydrogenating, plasma hydrogenation (using hydrogen excited by plasma) may be carried out. In addition, activation treatment may be carried out before forming the first interlayer insulating film 532.

Through the above-mentioned series of steps, an n-channel type TFT 533 and a p-channel type TFT 534 can be formed over one substrate.

Figure 8C:
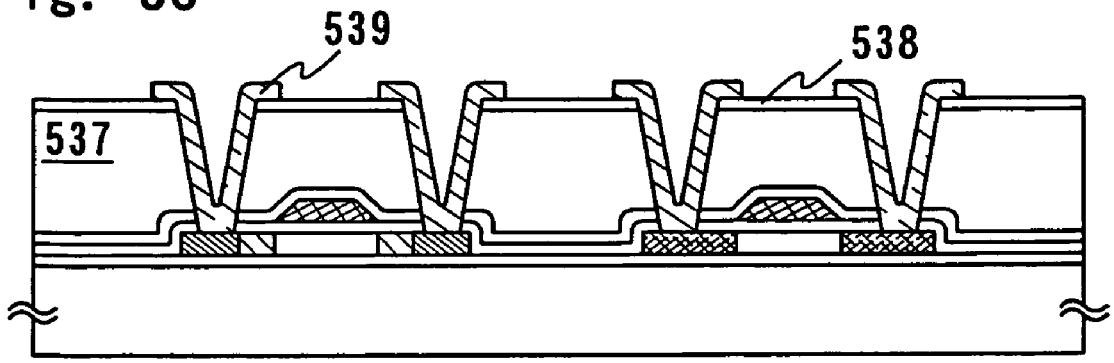

Then, as shown in FIG. 8C, a second interlayer insulating film 537 and a third interlayer insulating film 538 are formed so that the first interlayer insulating film 532 is covered. An organic resin film, an inorganic insulating film, an organopolysiloxane, or the like can be used for the second interlayer insulating film 537. In this embodiment, the second interlayer insulating film 537 is formed by using non-photosensitive acryl, which is one of an organic resin film.

Next, the gate insulating film 506, the first interlayer insulating film 532, the second interlayer insulating film 537, and the third interlayer insulating film 538 are etched to form a contact hole. Then, a wiring 539 that forms a contact with the island-shape semiconductor films 503 and 504 is formed.

After the step shown in FIG. 8C, a step of manufacturing an element capable of displaying a gradation according to an electrical signal (a display element) such as a liquid crystal cell and a light-emitting element used for a semiconductor display device is carried out.

Note that a step of adding an impurity imparting conductivity into a channel formation region to control a threshold voltage (channel dope) may be provided. For example, when an impurity imparting p-type conductivity is channel-doped, as well as the third doping treatment, a gas diluted with hydrogen so that the concentration of diborane ranges approximately from 1% to 30% and an inert gas added with $H_2O$ are flown into the chamber of the ion implantation apparatus, and thus ion implantation of B is carried out. Then, a gas diluted with hydrogen so that the concentration of diborane is 1% is flown into the chamber to have a flow rate ranging from 30 sccm to 60 sccm. In addition, when nitrogen is used as an inert gas, nitrogen added with $H_2O$ is flown into the chamber at a flow rate of, for example, 5 sccm. The amount of added $H_2O$ is that a component ratio of $H_2O$ to $H_3^+$ in the chamber, for example, ranges approximately from 0.1 to 1. Note that the amount of the added $H_2O$ is not limited thereto and a practitioner may determine the amount of the $H_2O$ appropriately so that the amount of the $H_2O$ in the chamber is constant regardless of opening and closing of the chamber.

Note that the method for manufacturing the semiconductor device using a top gate type TFT is shown in this embodiment; however, the invention is not limited thereto. It is possible to apply the invention also to a method for manufacturing a semiconductor device using a bottom gate type TFT.

The invention is not necessarily limited to the manufacturing method shown in this embodiment. The above manufacturing method just described one embodiment mode of the invention. Therefore, the invention is not limited to the above embodiment mode, and various changes based on a technical idea of the invention are possible.

EMBODIMENT 2

In this embodiment, after exposing a chamber to the atmosphere, a relation between an aging time to remove an impurity in the chamber and a concentration of boron, oxygen, and hydrogen in a semiconductor film into which doping of boron is carried out after aging is described.

Figure 9:
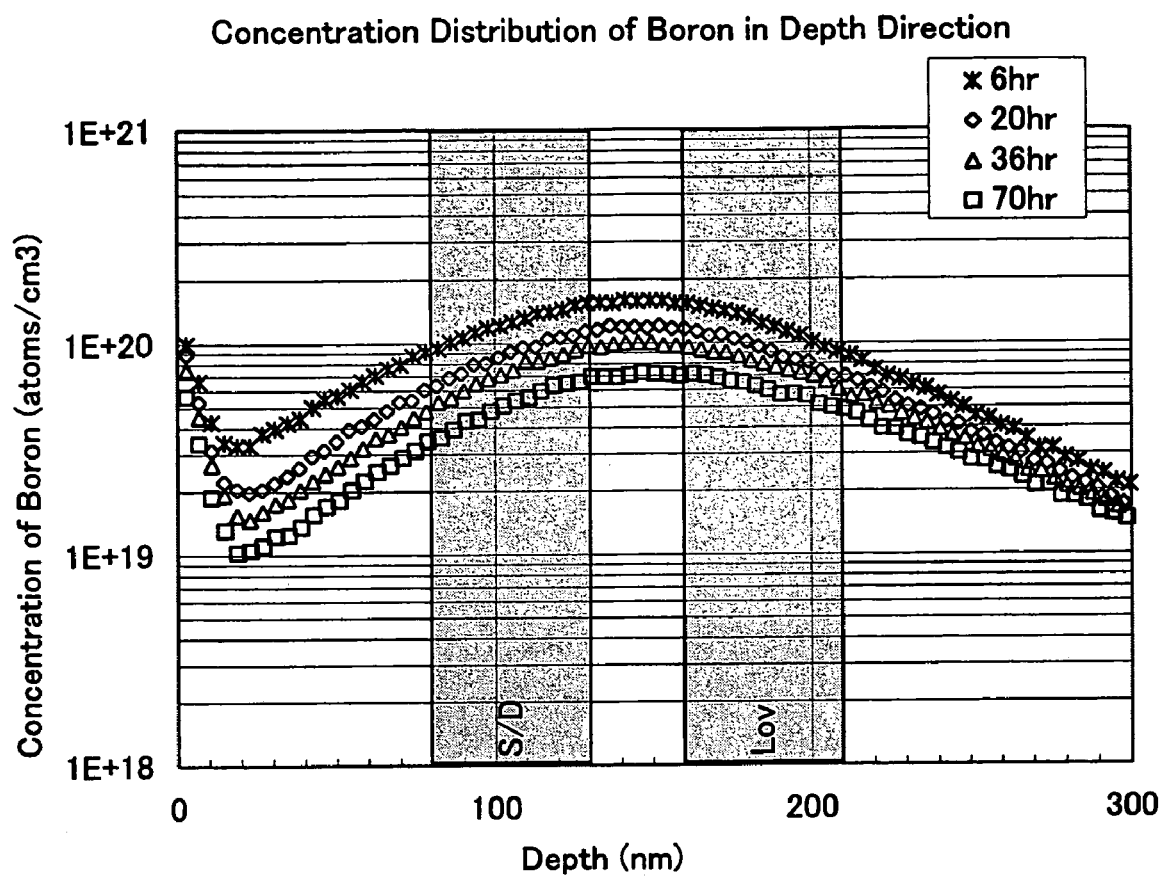
FIG. 9 is a graph showing concentration distribution of boron by SIMS measurement.

FIG. 9 shows a concentration (atoms/cm³) of boron to a depth (nm) of a sample measured by a secondary ion mass spectrometry (SIMS) by each aging time of after 6 hours, 36 hours, and 70 hours. A semiconductor film into which boron is directly doped is used for the sample used for SIMS measurement. When a TFT actually manufactured is assumed to be doped after a gate insulating film having a film thickness of approximately 80 nm is formed over a semiconductor film having a film thickness of approximately 50 nm, it is predicted that concentration distribution in a source/drain region corresponds to concentration distribution in a depth ranging from 80 nm to 130 nm shown in FIG. 9.

In addition, when a semiconductor film is doped so as to transmit through a gate electrode formed over a gate insulating film in a TFT actually manufactured, an impurity region (Lov region) overlapping with the gate electrode through the gate insulating film is formed. The gate electrode is unlikely to transmit ion than the semiconductor film at the time of ion implantation; therefore, it is assumed that double of the film thickness of the gate electrode corresponds to the film thickness of the semiconductor film. Thus, in this case, when the film thickness of the gate insulating film is assumed to be approximately 80 nm; that of the semiconductor film, approximately 50 nm; and that of the gate electrode, approximately 25 nm, it is predicted that concentration distribution in the Lov region corresponds to concentration distribution in a depth ranging from 160 nm to 210 nm shown in FIG. 9.

It is understood from the concentration distribution of boron shown in FIG. 9 that the shorter an aging time is, the higher a concentration of boron in a semiconductor film is; and the longer an aging time is, the lower a concentration of boron in a semiconductor film is.

Figure 10:
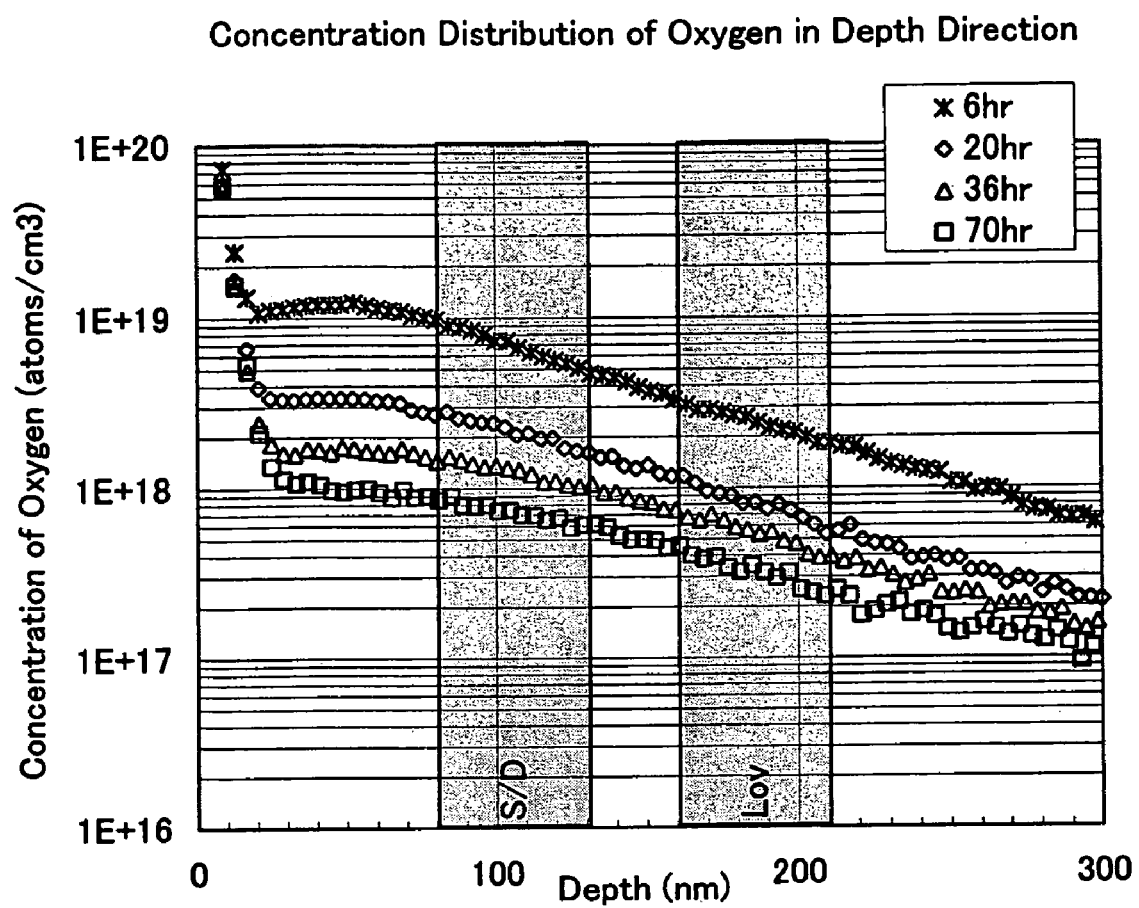
FIG. 10 is a graph showing concentration distribution of boron by SIMS measurement.

Then, FIG. 10 shows a concentration (atoms/cm³) of oxygen to a depth (nm) of a sample measured by a secondary ion mass spectrometry (SIMS) by each aging time of after 6 hours, 20 hours, 36 hours, and 70 hours. A sample used for SIMS measurement is the same as the case of FIG. 9. It is understood from the concentration of oxygen shown in FIG. 10 that the shorter an aging time is, the higher a concentration of oxygen in a semiconductor film is; and the longer an aging time is, the lower a concentration of oxygen in a semiconductor film is.

Figure 11:
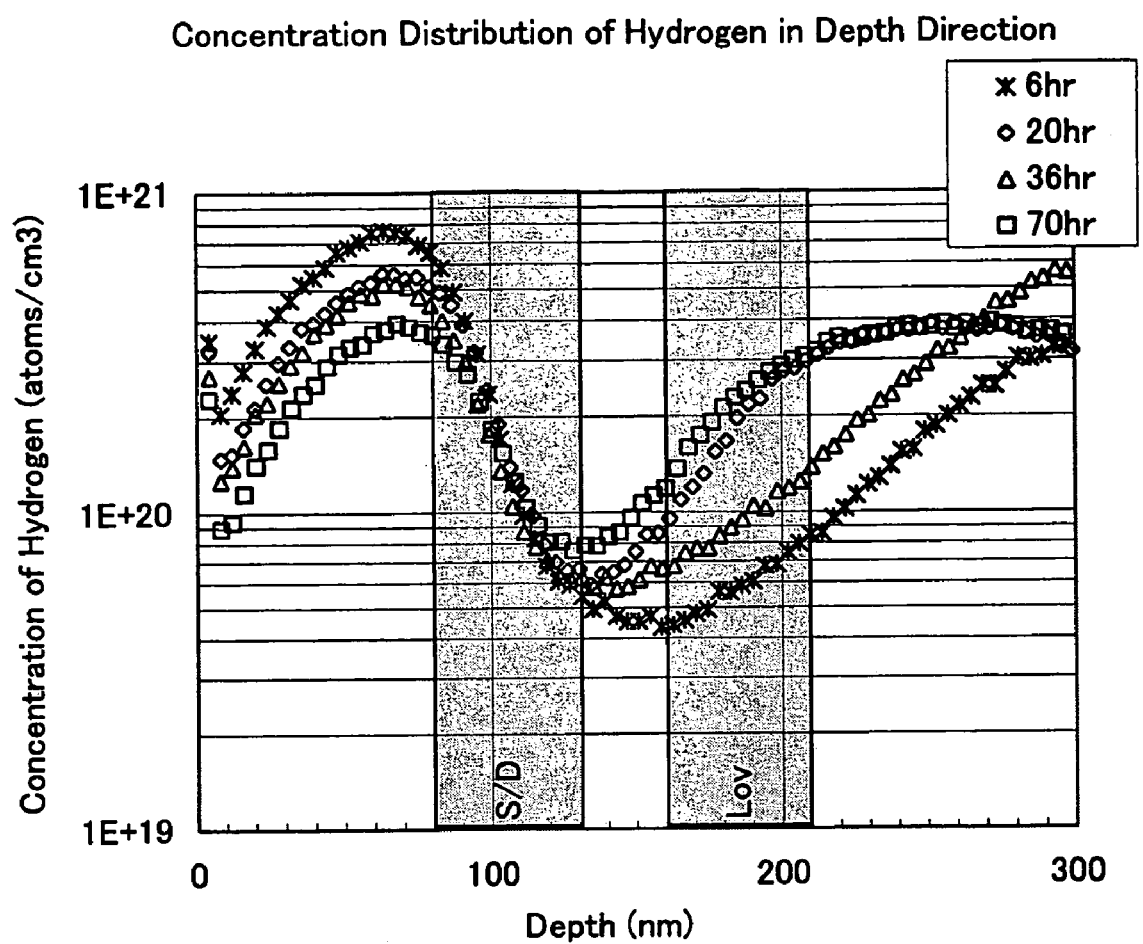
FIG. 11 is a graph showing concentration distribution of boron by SIMS measurement.

Next, FIG. 11 shows a concentration (atoms/cm³) of oxygen to a depth (nm) of a sample measured by a SIMS by each aging time of after 6 hours, 20 hours, 36 hours, and 70 hours. A sample used for SIMS measurement is the same as the case of FIG. 9. It is understood from the concentration of hydrogen shown in FIG. 11 that, the shorter an aging times is, the higher a concentration of hydrogen in a semiconductor film is; and the longer an aging time is, the lower a concentration of hydrogen in a semiconductor film is. On the other hand, in a deep region where the depth is more than 100 nm, it is understood that the shorter an aging times is, the lower a concentration of hydrogen in a semiconductor film is; and the longer an aging time is, the higher a concentration of hydrogen in a semiconductor film is.

Figure 12A:
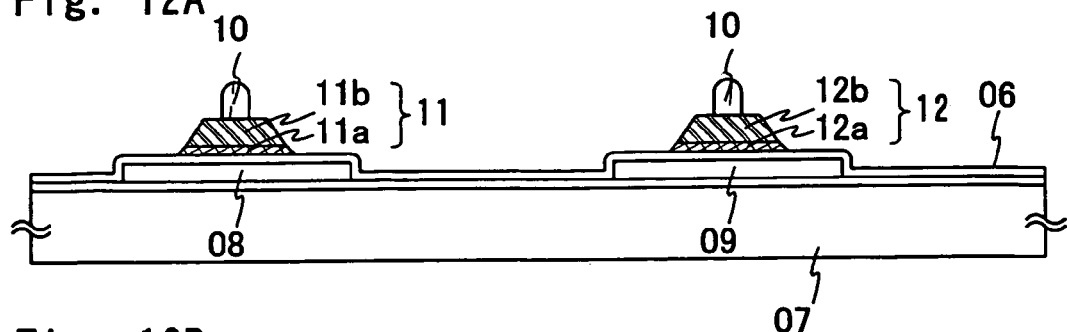
FIGS. 12A to 12E are views showing a method for manufacturing a sample used for measurement of source/drain resistance in Embodiment 2.
Figure 12B:
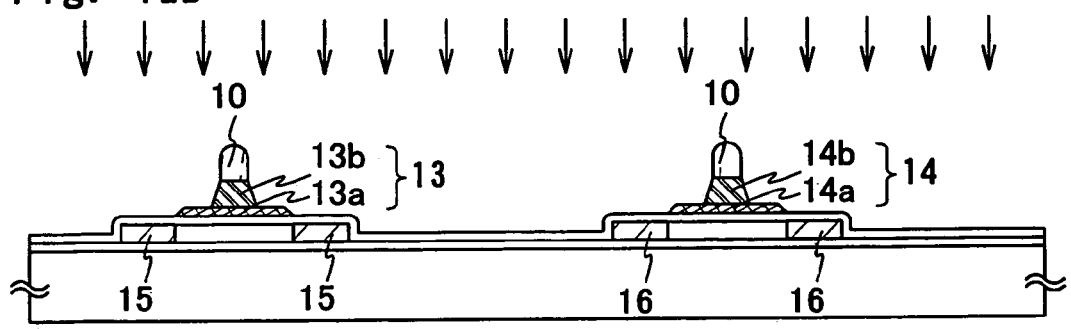
Figure 12C:
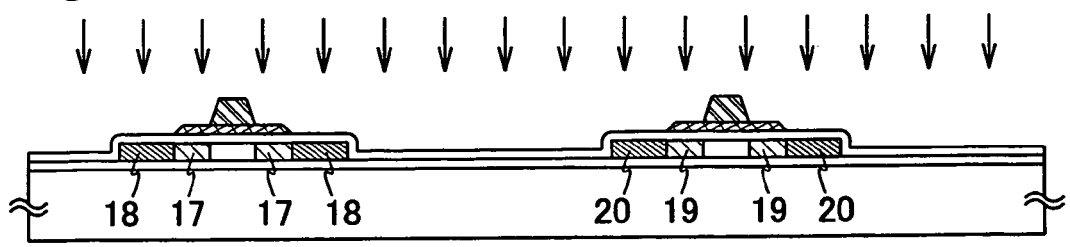
Figure 12D:
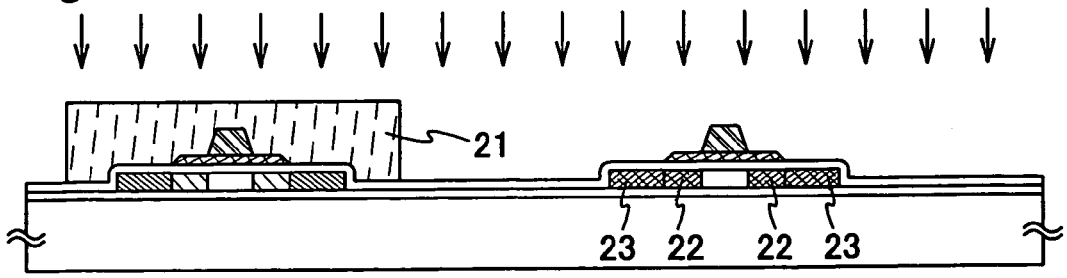
Figure 12E:
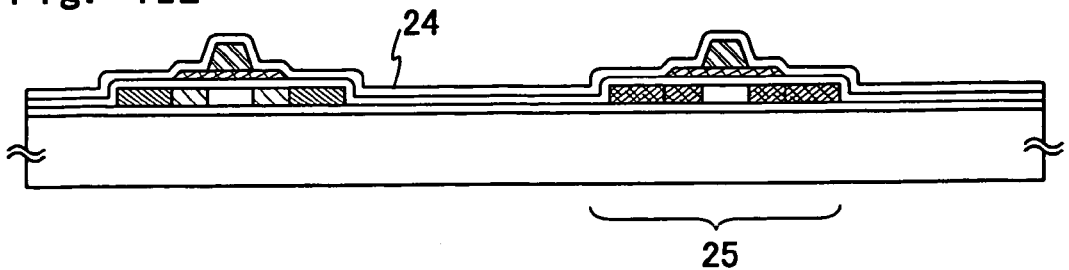
Figure 13:
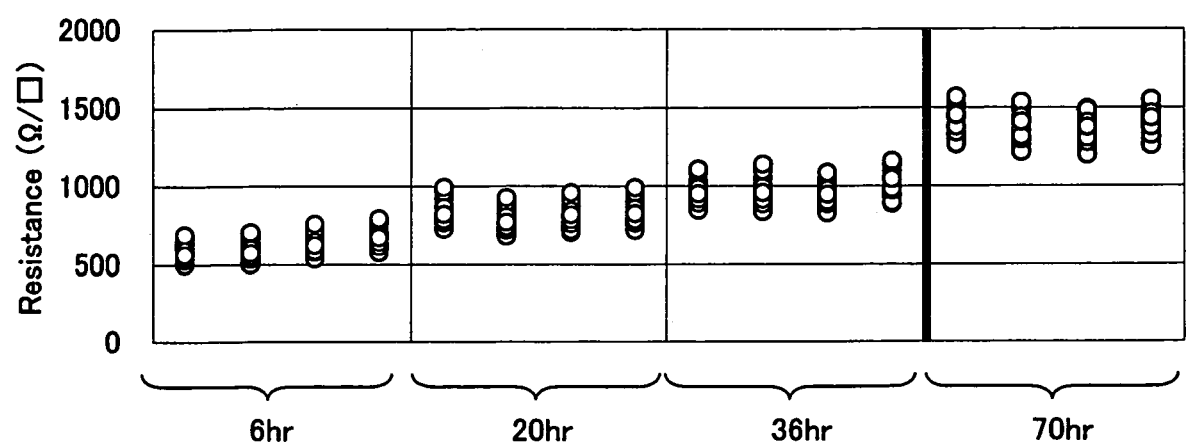
FIG. 13 is a measured value of source/drain resistance in every aging time.

Then, a TFT is formed by using an aging time to remove an impurity in the chamber and the semiconductor film that is doped after aging, and a result of measurement of source/drain resistance of the TFT is shown in FIG. 13. First, a method for manufacturing a TFT used as a sample is described with reference to FIGS. 12A to 12E.

First, as shown in FIG. 12A, semiconductor films 08 and 09 are formed over an insulating surface of a substrate 07. In this embodiment, a polycrystalline semiconductor is used for the semiconductor films 08 and 09. A film thickness of the semiconductor films 08 and 09 is set to be 50 nm. Then, a gate insulating film 06 with a film thickness of 115 nm; TaN, 30 nm; and W, 370 nm are sequentially formed over the semiconductor films 08 and 09 by using silicon oxide. Then, the TaN and the W are etched by using a mask 10 to form double-layered conductive films 11 (a lower layer 11a and an upper layer 11b) and 12 (a lower layer 12a and an upper layer 12b).

Next, as shown in FIG. 12B, the double-layered conductive films 11 and 12 are etched to form gate electrodes 13 (a lower layer 13a and an upper layer 13b) and 14 (a lower layer 14a and an upper layer 14b) by using the mask 10 of which width gets narrow by being etched in the above etching treatment. Note that the gate electrode 13 is etched so that a width of a channel length direction of the lower layer 13a is longer than that of the upper layer 13b. The gate electrode 14 is etched so that a width of a channel length direction of the lower layer 14a is longer than that of the upper layer 14b. Through the above etching treatment carried out twice, the gate insulating film 06, which is an exposed portion without being overlapped with the gate electrodes 13 and 14 is etched to have a film thickness of 80 nm.

Then, as shown in FIG. 12B, phosphorus is added into the semiconductor films 08 and 09 (a first doping treatment) by using the gate electrodes 13 and 14 as masks. Doping is carried out by an ion implantation method. Doping is carried out under a dose amount of $7 \times 10^{13}$ ions/cm$^2$ and an acceleration voltage of 50 kV. Through the first doping treatment, first impurity regions 15 and 16 are formed in a self-aligned manner.

Next, as shown in FIG. 12C, only the upper layers 13b and 14b are used as masks between the gate electrodes 13 and 14 to carry out second doping treatment. In the second doping treatment, doping is carried out under an acceleration voltage of 65 kV and a dose amount of $3 \times 10^{15}$ ions/cm$^2$ so that an impurity passes through the lower layers 13a and 14a. Through the second doping treatment, second impurity regions 18 and 20 are formed in a region exposed without being overlapped with the gate electrodes 13 and 14. In addition, third impurity regions 17 and 19 are formed in a region overlapped only with the lower layers 13a and 14a between the gate electrodes 13 and 14.

Subsequently, as shown in FIG. 12D, a third doping treatment is carried out. In the third doping treatment, diborane ($B_2H_6$) is used as dopant and it is carried out by covering the semiconductor film 08 with a mask 21. It is carried out under an acceleration voltage of 80 kV and a dose amount of $2 \times 10^{16}$ ions/cm . Through the third doping treatment, fourth impurity regions 22 and 23 are formed in a region exposed without being overlapped with the upper layer 14b of the gate electrode 14. Note that only the fourth impurity region 22 between the fourth impurity regions 22 and 23 is overlapping with the lower layer 14a of the gate electrode 14.

Next, as shown in FIG. 12E, a passivation film 24 is formed. Then, heat treatment is carried out in an atmosphere containing hydrogen to activate the impurity element added into the semiconductor films 08 and 09.

Source/drain resistance of a p-type TFT 25 manufactured by the above-mentioned series of steps is shown in FIG. 13. Note that, FIG. 13 shows source/drain resistance in the third doping treatment by each aging time of after 6 hours, 20 hours, 36 hours, and 70 hours. It is understood from FIG. 13 that the shorter an aging time is, the lower source/drain resistance is.

According to the above embodiment of the invention, the ion species ratio of B in the chamber can be kept constant regardless of exposure to the atmosphere. Thus, a down time of the ion implantation apparatus after exposing the chamber to the atmosphere can be shorten and throughput can be improved. In addition, $H_2O$ is supplied to the chamber, so that the ion species ratio of B can be raised much more and throughput during the ion implantation step of B can be improved as compared to the case when the concentration of $H_2O$ is infinitely converged to 0.

This application is based on Japanese Patent Application serial No. 2003-307236 filed in Japanese Patent Office on Aug. 29 in 2003, the contents of which are hereby incorporated by reference.

What is claimed is:

1. An ion implantation apparatus comprising:
   a chamber;
   an ion source for ionizing an impurity imparting p-type conductivity and supplying the ionized impurity to the chamber; and
   a supplying unit to supply an inert gas and $H_2O$ to the chamber.

2. An ion implantation apparatus comprising:
   a chamber;
   an ion source for ionizing an impurity imparting p-type conductivity and supplying the ionized impurity to the chamber;
   a $H_2O$ supplying unit to supply $H_2O$ to the chamber; and
   an inert gas supplying unit to supply an inert gas to the $H_2O$ supplying unit.

3. An ion implantation apparatus comprising:
   a chamber;
   an ion source connected to the chamber;
   a dopant supplying unit to supply a dopant to the ion source; and
   an inert gas supplying unit to supply an inert gas and $H_2O$ to the ion source;
   wherein the ion source ionizes the dopant, and supplies the ionized dopant with the inert gas and the $H_2O$ to the chamber.

4. An ion implantation apparatus comprising:
   a chamber;
   an ion source connected to the chamber;
   a dopant supplying unit to supply a dopant to the ion source;
   a $H_2O$ supplying unit to supply $H_2O$ to the ion source; and
   an inert gas supplying unit to supply an inert gas to the $H_2O$ supplying unit;
   wherein the ion source ionizes the dopant, and supplies the ionized dopant with the $H_2O$ and the inert gas to the chamber.

5. An ion implanting apparatus according to claim 1, wherein the impurity is B, Al, Ga, In or Zn.

6. An ion implanting apparatus according to claim 2, wherein the impurity is B, Al, Ga, In or Zn.

7. An ion implanting apparatus according to claim 3, wherein the dopant is B, Al, Ga, In or Zn.

8. An ion implanting apparatus according to claim 4, wherein the dopant is B, Al, Ga, In or Zn.

9. An ion implanting apparatus according to claim 1, wherein the ion source is a high-frequency discharge type ion source or a DC arc discharge type ion source.

10. An ion implanting apparatus according to claim 2, wherein the ion source is a high-frequency discharge type ion source or a DC arc discharge type ion source.

11. An ion implanting apparatus according to claim 3, wherein the ion source is a high-frequency discharge type ion source or a DC arc discharge type ion source.

12. An ion implanting apparatus according to claim 4, wherein the ion source is a high-frequency discharge type ion source or a DC arc discharge type ion source.

13. An ion implanting apparatus according to claim 2, wherein the inert gas is argon.

14. An ion implanting apparatus according to claim 4, wherein the inert gas is argon.

* * * * *